(12) United States Patent
Kolanek

(10) Patent No.: US 6,633,200 B2
(45) Date of Patent: Oct. 14, 2003

(54) MANAGEMENT OF INTERNAL SIGNAL LEVELS AND CONTROL OF THE NET GAIN FOR A LINC AMPLIFIER

(75) Inventor: James C. Kolanek, Goleta, CA (US)

(73) Assignee: Celiant Corporation, Warren, NJ (US)

( * ) Notice: Subject to any disclaimer, the term of this patent is extended or adjusted under 35 U.S.C. 154(b) by 0 days.

(21) Appl. No.: 09/887,467

(22) Filed: Jun. 21, 2001

(65) Prior Publication Data

US 2002/0047745 A1 Apr. 25, 2002

Related U.S. Application Data
(60) Provisional application No. 60/213,721, filed on Jun. 22, 2000.

(51) Int. Cl.[7] .............................................. H03F 1/26
(52) U.S. Cl. .................................... 330/149; 107/129
(58) Field of Search .............................. 330/107, 129, 330/136, 149, 124 R

(56) References Cited

U.S. PATENT DOCUMENTS

| | | | |
|---|---|---|---|
| 3,777,275 A | 12/1973 | Cox | 330/10 |
| 3,896,395 A | 7/1975 | Cox | 330/10 |
| 3,909,742 A | 9/1975 | Cox et al. | 330/124 R |
| 3,927,379 A | 12/1975 | Cox et al. | 330/10 |
| 5,886,573 A | 3/1999 | Kolanek | 330/10 |
| 5,892,395 A * | 4/1999 | Stengel et al. | 330/124 R |
| 5,901,346 A * | 5/1999 | Stengel et al. | 330/129 |
| 5,990,738 A | 11/1999 | Wright et al. | 330/149 |
| 6,147,553 A | 11/2000 | Kolanek | 330/10 |
| 6,215,354 B1 | 4/2001 | Kolanek et al. | 330/2 |

OTHER PUBLICATIONS

H. Chireix, "High Power Outphasing Modulation", Proceedings of the Institute of Radio Engineers, vol. 23, No. 11, pp. 1370–1392, Nov. 1935.

D. C. Cox, "Linear Amplification with Nonlinear Components", IEEE Transactions on Communications, vol. COM–22, pp. 1942–1945, Dec. 1974.

Frederick H. Raab, "Efficiency of Outphasing RF Power–Amplifier Systems", IEEE Transactions on Communications, vol. Com–33, No. 10, Oct. 84.

S. A. Hetzel, et al., "LINC Transmitter", Electronic Letters, vol. 27, No. 10, May 1991.

L. Sundstrom, "Effects of reconstruction filters and sampling rate for a digital component separator on LINC transmitter performance", Electronic Letters, vol. 31, No. 14, Jul. 1995.

Lars Sundstrom, "The Effect of Quantization in a Digital Signal Component Separator for LINC Transmitters", IEEE Trans. on Vehicular Tech., vol. 45, No. 2, May 1996.

Bernoux, Jean–Paul et al., "Method of Balancing the Channels of a LINC Amplifier", WO 96/19063, Jun. 1996.

* cited by examiner

Primary Examiner—Robert Pascal
Assistant Examiner—Khanh Van Nguyen
(74) Attorney, Agent, or Firm—Blakely, Sokoloff, Taylor & Zafman LLP

(57) ABSTRACT

An amplifier subsystem has a modulator to generate a pair of constant amplitude phase-modulated components which are in response to an input signal, a pair of channels that include a pair of power amplifiers to amplify the components, and a combiner to combine the amplified components. A number of variable gain elements are coupled into some of a number of signal paths of the amplifier subsystem. A controller is to receive feedback from the amplifier subsystem and in response maintains signal levels of some of the signal paths within predefined ranges and controls a net gain of the linear amplifier, by adjusting the variable gain elements.

15 Claims, 6 Drawing Sheets

MANAGEMENT OF INTERNAL SIGNAL LEVELS AND CONTROL OF THE NET GAIN FOR A LINC AMPLIFIER

This application takes the benefit of the earlier filing date of U.S. provisional application Ser. No. 60/213,721 filed Jun. 22, 2000 and entitled, "Signal Level Management for an Amplifier".

BACKGROUND INFORMATION

The invention relates in general to the field of high power linear amplification and in particular to a technique of controlling the operation of a LINC style RF amplifier.

Many applications exist that require high power radio frequency (RF) amplifiers capable of linear operation while at the same time operate at high efficiency. Linear operation is desirable due to the presence of amplitude modulation on many types of input signals and regulatory requirements to minimize spurious or out of channel response. Efficiency is desirable due to the economics of minimizing thermal loading and operational costs. Normally, achieving the combination of linear operation and high efficiency has proven difficult.

An approach to implementing a high power amplifier that is both linear and efficient was first proposed by Chireix in 1935 as described in H. Chireix, "High Power Outphasing", Proc. IRE, Vol. 23, No. 11, November 1935, pp 1370–1392. Chireix's concept was based on an outphasing approach in which the input signal is decomposed into a pair of constant amplitude signals, which are then amplified by a pair of efficient, possibly non-linear, RF amplifiers, and then linearly combined to form the high power output. Cox later revived this concept in the early 1970's and coined the term LINC (Linear Amplification Using Non-Linear Components) by which this amplifier design concept is popularly known today. See D. C. Cox, "Linear Amplification with Nonlinear Components", IEEE Trans. Comm., December 1974, pp 1942–1945.

The LINC amplifier has a LINC modulator which decomposes an input signal into two or more constant-amplitude phase-modulated components. Each component is then amplified in a separate channel, by a phase-preserving high power amplifier (HPA, which may otherwise be nonlinear). A power combiner is also provided to combine the amplified components of the different channels, resulting in a linearly amplified version of the input signal. To improve overall linearity, the accuracy of the LINC modulator may be enhanced by implementing it using digital signal processing. See, e.g. S. A. Hetzel, A. Bateman, J. P. McGeehan, "LINC Transmitter", pp 844–846, Electronic Letters, Vol. 27. No. 9, May 9, 1991; L. Sundstrom, "Effects of Reconstruction Filters and Sampling Rate For A Digital Signal Component Separator On LINC Transmitter Performance", Electronic Letters, pp 1124–1125, Vol. 31, No. 14, Jul. 6, 1995; L. Sundstrom, "The Effect of Quantization In A Digital Signal Component Separator For LINC Transmitters", IEEE Trans. Vehicular Technology, pp 346–352, Vol. 45, No. 2, May 2, 1996. Linearity is also improved by balancing the frequency response of the channels in which the components are amplified. This has been done using automatic digital equalization filters in one or more of the channels, which compensate the components for any expected imbalance between the channels that might cause distortion at the power combiner output. See e.g. WO 96/19063, "Method of Balancing the Channels of a LINC Amplifier", Jun. 20, 1996; U.S. Pat. No. 5,886,673 "Amplification Using Amplitude Reconstruction of Amplitude and/or Angle Modulated Carrier", Mar. 23, 1999; U.S. Pat. No. 5,990,738, "Compensation System and Methods for a Linear Power Amplifier", Nov. 23, 1999; U.S. Pat. No. 6,215,354, "Closed Loop Calibration for an Amplitude Reconstruction Amplifier". However, changing operating conditions internal to the amplifier can alter the overall gain of the conventional LINC amplifier. This means that the overall, or net, gain of the amplifier is varying during operation, which is an undesirable characteristic.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only. It should be noted that references to "an" embodiment in this disclosure are not necessarily to the same embodiment, and they mean at least one.

FIG. 1 shows a block diagram of a LINC amplifier.

FIG. 2 illustrates the relative bandwidths of a multi-carrier input signal and the channel filter.

FIG. 3 shows an embodiment of a LINC amplifier with signal level management elements.

FIG. 4 depicts a control structure for the signal level management controller.

FIG. 5 shows an example of the variation in a programmable M value under control of a discrete gain element parameter G(k).

FIG. 6 shows a block diagram of a control structure that uses discrete control of an analog channel gain element.

FIG. 7 shows a flow diagram of an embodiment of a method for operating a LINC amplifier.

DETAILED DESCRIPTION

A signal level and gain management scheme is described. According to an embodiment, variable internal gain elements are introduced into the LINC amplifier structure in order to maintain internal signal levels at predetermined levels (e.g. optimum signal levels, such as, for example, an optimum SNR) while at the same time permit control of the net gain of the LINC amplifier. This is accomplished using a feedback control structure that uses various signals, including the input, output and amplifier channel signals. In the following description, numerous details are set forth in order to provide a thorough description of the present invention. It will be apparent, however, to one skilled in the art, that the present invention may be practiced without these specific details. In other instances, well-known structures and devices are shown in block diagram form, rather than in detail, in order to avoid obscuring the present invention.

Some portions of the detailed descriptions that follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention also relates to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description below. In addition, the present invention is not described with reference to any particular programming language. It will be appreciated that a variety of programming languages may be used to implement the teachings of the invention as described herein.

A machine-readable medium includes any mechanism for storing or transmitting information in a form readable by a machine (e.g., a computer). For example, a machine-readable medium includes read only memory ("ROM"); random access memory ("RAM"); magnetic disk storage media; optical storage media; flash memory devices; electrical, optical, acoustical or other form of propagated signals (e.g., carrier waves, infrared signals, digital signals, etc.); etc.

A LINC Amplifier

Figure 1:
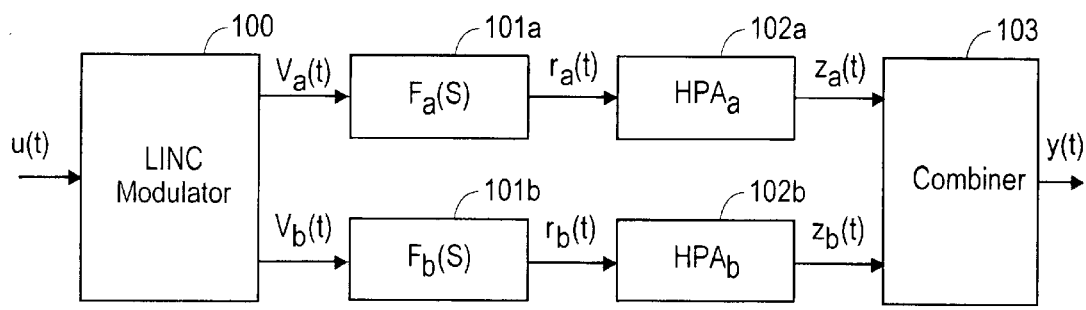

A block diagram of a LINC amplifier is shown in FIG. 1. The LINC amplifier has a modulator 100 to generate a pair of constant amplitude LINC channel signals, a pair of LINC gain channels or signal processing paths containing the high power amplifiers (HPAs) 102a, 102b and finally a combiner 103 to form the output signal. The two channel response functions 101a, 101b may contain equalizer elements used to reduce, and potentially minimize, the variation between the overall frequency responses of the channels.

The operation of the LINC amplifier in FIG. 1 may be as follows. If u(t) is an arbitrary input signal consisting of an amplitude component $a_u(t)$ and a phase component $\beta_u(t)$ then u(t) may be defined as $$u(t) = a_u(t)\cos(\beta_u(t)) = Re\{a_u(t)e^{j\beta_u(t)}\} \qquad (1)$$

It will be convenient to use the complex form used in (1), known as the pre-envelope, to represent a generic single carrier or composite multiple carrier signal in the following description. The conversion between real and complex notation can be performed when needed for design purposes.

The LINC modulator operates on u(t) to generate two constant amplitude signals, $v_a(t)$ and $v_b(t)$, that, in the dual channel embodiment shown in FIG. 1, are essentially exact decompositions of the input signal. These signals may be expressed as $$v_a(t) = A_v e^{j[\beta(t)+\theta(t)]}$$

$$v_b(t) = A_v e^{j[\beta(t)-\theta(t)]} \qquad (2)$$

where $A_v$ is the nominal LINC channel signal amplitude out of the modulator 100 and $\theta(t)$ is the LINC channel phase modulation imparted by the LINC modulator 100. With $A_{clip}$ being some defined maximum or clip level imposed on the input signal amplitude, a normalized input amplitude may be defined such that $$\bar{a}_u(t) = \begin{cases} a_u(t)/A_{clip}, & a_u(t) \leq A_{clip} \\ 1, & a_u(t) > A_{clip} \end{cases} \qquad (3)$$

The LINC phase modulation $\theta(t)$ is thus given by $$\theta(t) = \cos^{-1}(\bar{a}(t)) \qquad (4)$$

In the LINC amplifier shown in FIG. 1, the signals $v_a$ and $v_b$ may be filtered by the channel response functions 101a and 101b, amplified by high power amplifiers $HPA_a$ and $HPA_b$ and then combined to form the output signal y(t). It can be shown that this output consists of a high power replica of the input signal. For instance, if $K_{hpa}$ is the voltage gain of the HPAs and the channel response functions have unity gain (in the ideal case), and the combiner output y(t) is the sum of the HPA output signals $z_a(t)$ and $z_b(t)$ (i.e. $y(t) = z_a(t) + z_b(t)$), then the output is given by $$\begin{aligned} y(t) &= z_a + z_b \\ &= K_{hpa}[v_a(t) + v_b(t)] \\ &= K_{hpa}A_v[e^{j\theta(t)} + e^{-j\theta(t)}]e^{j\beta(t)} \\ &= 2K_{hpa}A_v\bar{a}_u(t)e^{j\beta(t)} \\ &\triangleq 2K_{hpa}A_v\bar{u}(t) \end{aligned} \qquad (5)$$

where $\bar{u}(t) = \bar{a}_u(t) \cdot \exp(j\beta_u(t))$ is a clipped version of the input signal u(t). If max $a_u(t) \leq A_{clip}$, then an unclipped output results where $$\begin{aligned} y(t) &= \frac{2K_{hpa}A_v}{A_{clip}}u(t) \\ &\triangleq G_{amp}u(t) \end{aligned} \qquad (6)$$

In this embodiment, the net amplifier gain, $G_{amp}$, for the LINC amplifier is given by $$G_{amp} = \frac{2K_{hpa}A_v}{A_{clip}} \quad (7)$$

The clipping on the output indicated in (7) can introduce distortion on the output signal but this can be controlled in the LINC amplifier. For multi-carrier code division multiple access (CDMA) applications, clip (or peak) to average power ratios of 8 to 10 dB will generally maintain distortion products below maximum allowed values.

The presence of the channel response functions $F_a(s)$ and $F_b(s)$ by themselves does not directly interfere with the operation of the LINC amplifier. To demonstrate, assume the channel response function output signals, $r_a(t)$ and $r_b(t)$ are given using the convolution notation $$r_a(t) = v_a(t) * f_a(t)$$
$$r_b(t) = v_b(t) * f_b(t) \quad (8)$$

where $f_a(t)$ and $f_b(t)$ are the impulse response functions of the two equalizers. The Laplace functions for these two equalizers are given by $F_a(s)$ and $F_b(s)$. If the two signals $r_a$ and $r_b$ are amplified with gain $K_{hpa}$ and combined, the resultant output is given by $$y(t) = K_{hpa}[r_a(t) + r_b(t)] \quad (9)$$
$$= K_{hpa}[v_a(t) * f_a(t) + v_b(t) * f_b(t)]$$

If the two channel response functions are identical (i.e. $f_a(t) = f_b(t) = f(t)$), the output becomes $$y(t) = K_{hpa}[v_a(t) + v_b(t)] * f(t) \quad (10)$$
$$= 2K_{hpa}A_v[\bar{u}(t) * f(t)]$$

In the frequency domain, this becomes $$Y(s) = 2K_{hpa}A_v \bar{U}(s) \cdot F(s) \quad (11)$$

Figure 2:
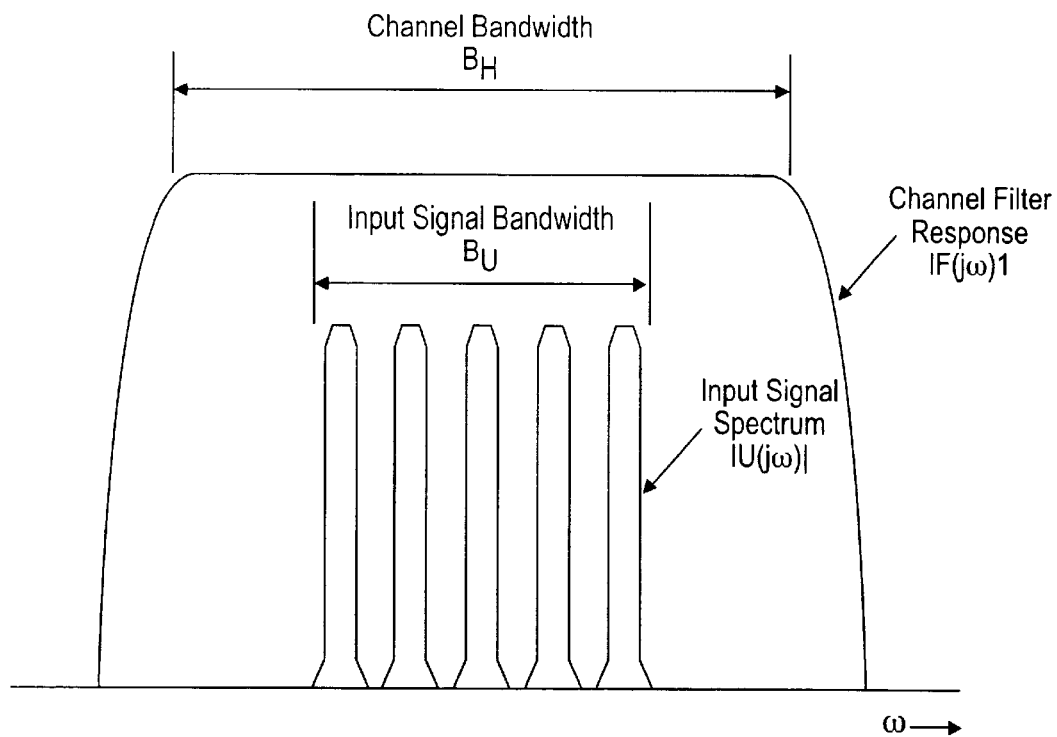

In other words, if $f_a(t)$ and $f_b(t)$ are identical and have characteristics which would not otherwise introduce distortion on the original input signal u(t), then they will not directly degrade the operation of the LINC amplifier. The equalizers that might contribute to the channel response response function F(s) typically will have wide bandpass characteristics that can pass the input signal with little if any distortion. These characteristics are illustrated in FIG. 2 that shows schematically a typical multicarrier input U(ω) signal spectrum and the band pass frequency response of F(ω). The bandwidth of the channel response function, $B_H$, is much wider than the range of frequencies $B_U$ spanned by the input signal.

An advantage for the LINC amplifier described above is its potential for very efficient amplification of signals with high amplitude modulation (AM) content. In Chireix's original publication, he envisioned the LINC amplifier operating at high efficiencies using a lossless three-port combiner. Typically, this combiner consists of a transformer or transmission line configuration connected to the output of the two HPA's. For certain higher-class amplifiers, efficiency can theoretically approach 100 percent. The three-port combiner LINC configuration using ideal Class B amplifiers permits efficiencies on the order of 50 percent were feasible for Gaussian class signals. This would include CDMA or multi-carrier class signals.

Equation (7) would appear to indicate that the gain of a LINC amplifier is fixed by the three parameters: the clip level $A_{clip}$, the magnitude $A_v$ of the two constant amplitude signals produced by the LINC modulator 100, and the gain $K_{hpa}$ of the two HPA's 102a and 102b. However, a practical implementation of the LINC amplifier may involve a digital signal processing subsystem, and the associated frequency translators needed to interface RF input and output signals to lower frequency signals (so-called intermediate frequency (IF) or baseband signals) that can be used by the digital subsystem. As signals are processed within analog and digital processing elements, such as the equalizers, other gain factors are introduced that will change the net gain of the amplifier and also yield an otherwise less optimal operation that may adversely affect linearity and efficiency of the amplifier.

According to an embodiment, certain signal levels are maintained at optimum levels in order to maximize signal to noise ratios (SNR) while at the same time insuring that distortion due to signal compression effects in the analog elements and/or overflow condition in the digital processing elements are not exceeded. Further, as the input signal level varies in an embodiment, such as when the base station varies the drive level as part of a power management process, traffic channels are added, or the number of RF carriers are changed, variable gains are introduced in the design in order to maintain signal levels at some predetermined levels, e.g. optimum levels. In addition, it will be shown that the gain elements used to set one signal level are highly interactive with the levels of other signals, the channel balance, and/or the net gain of the LINC amplifier. Consequently, some form of automatic control is provided according to an embodiment to manage the internal gains to maintain a constant amplifier gain at some preset operating point, while at the same time maintain internal signal levels within predetermined ranges, e.g. optimum levels.

A LINC Amplifier with Signal Level Management

Figure 3:
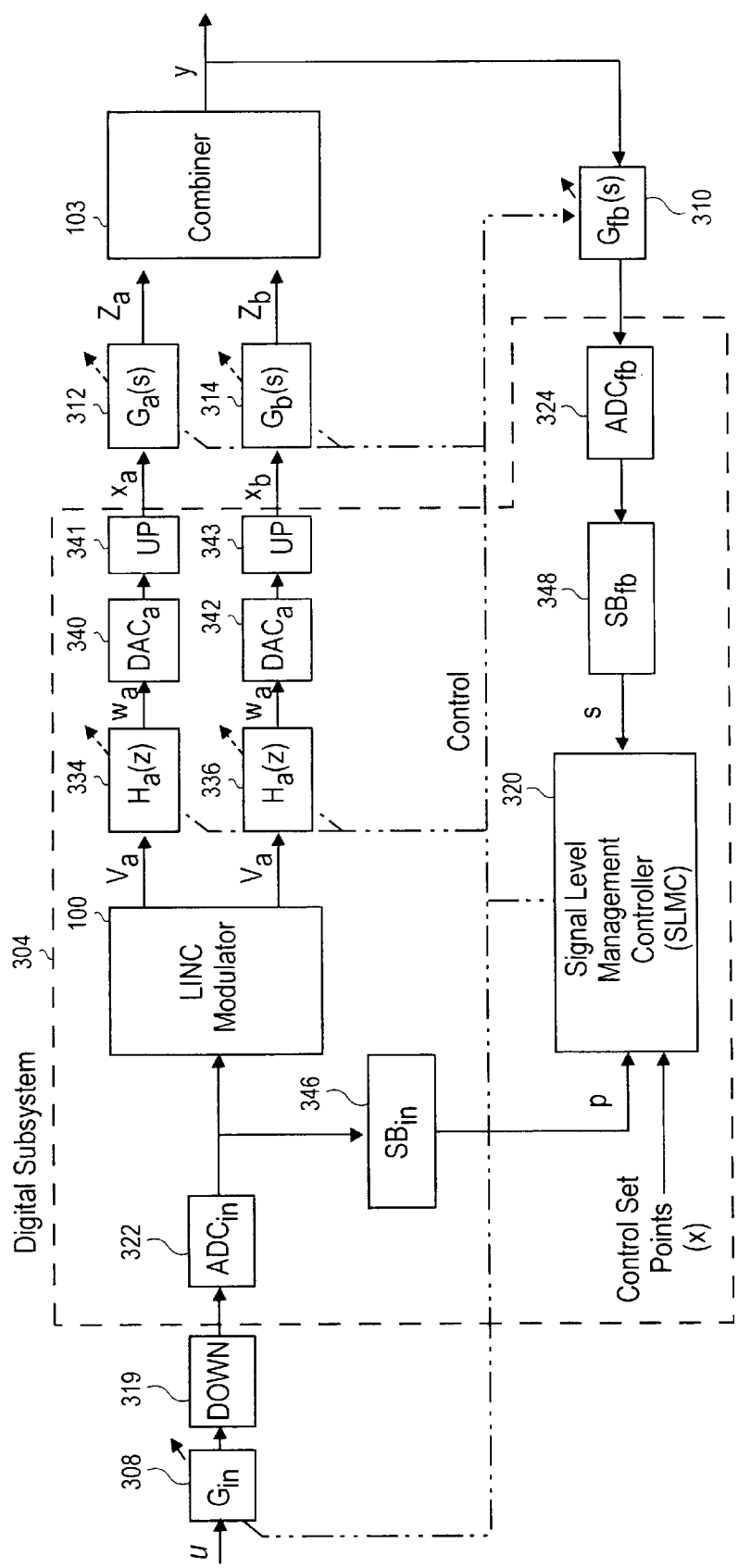

FIG. 3 is a block diagram showing an embodiment of a high power LINC amplifier incorporating features of a signal level and gain management process. Referring to FIG. 3, the linear amplifier includes an amplifier subsystem that comprises the modulator 100 designed to generate a pair of constant-amplitude phase-modulated components $v_a$ and $v_b$ which are a decomposition of an input signal u. A pair of channels include a pair of power amplifiers $HPA_a$ 102a and $HPA_b$ 102b that are coupled to amplify the components $v_a$ and $v_b$, respectively. The combiner 103 is coupled to combine the amplified components. A number of variable gain elements such as, for example, $G_{in}$ 308, $G_{fb}$ 310 are coupled into some of a number of signal paths of the amplifier subsystem. A signal level management controller (SLMC) 320 is coupled to receive feedback from the amplifier subsystem. In this embodiment, there is a feedback path from the output of the combiner 103 that provides signal samples. In response to such feedback and samples p of the input, the controller maintains signal levels of some of the signal paths within predefined ranges and controls a net gain of the linear amplifier by adjusting the variable gain elements. The control paths between the SLMC 320 and the various variable gain elements are depicted by dotted lines.

In the embodiment shown in FIG. 3, the amplifier subsystem further includes an equalizer that is coupled in a signal path between the modulator 100 and the power amplifiers 102a and 102b. This equalizer is depicted in this embodiment by separate equalization filters 334 and 336 which make amplitude and phase corrections in one or both of the components obtained from the modulator 100. The corrections by the equalizer may be made at one frequency or at several; the latter may also be referred to as frequency response corrections. The equalization filters may be of the analog and/or digital variety. The equalization filters 334, 336 are coupled to be controlled by the SLMC 320 so that the variation in frequency response between the pair of channels shown is reduced, and potentially minimized.

The embodiment of FIG. 3 also features a digital subsystem 304 that includes input and feedback analog to digital converters, $ADC_{in}$ 322 and $ADC_{fb}$ 324, a digitally implemented LINC modulator 100 and equalizer filters, $H_a(z)$ 334 and $H_b(z)$ 336, and two digital to analog converters $DAC_a$ 340 and $DAC_b$ 342. A pair of signal buffers, $SB_{in}$ 346 and $SB_{fb}$ 348, are also included in the digital subsystem 304 and are used to capture signal samples p and s, respectively, for processing by the SLMC 320.

The exemplary four variable gain elements, $G_{in}$, $G_a$, $G_b$ and $G_{fb}$, shown in the embodiment of FIG. 3 may be part of frequency converter modules used to interface between RF input and output signals u and y, and lower frequency (e.g. baseband or IF) signals supplied to ADC's 322 and 324 and received from the DAC's 340 and 342. An RF to IF down converter 319 may be coupled to translate the input signal into a baseband or IF range prior to being digitized by the ADC 322. Similarly, an IF to RF up converter 341, 343 may be coupled to translate the corrected components $x_a$ and $x_b$ into an RF range prior to being amplified by the high power amplifiers 102a and 102b. The input and feedback path gain elements, $G_{in}$ and $G_{fb}$, control the signal level into the two ADC's. The channel path gains, $G_a$ and $G_b$, represent the controllable large signal analog gains relating the DAC 340, 342 output to the outputs of the HPA 102a, 102b contained in each channel. The $G_a$ and $G_b$ may be designed to control the power level of each component that is fed into the combiner. As an alternative to being a part of frequency translation units, the effects of $G_a$ and $G_b$ may be achieved by a variable attenuator at the input to the HPAs, by a variable HPA power supply voltage, or by a variable HPA internal bias. The HPAs may not necessarily be linear amplifiers. For example, they could be nonlinear Class C, D, E, or F amplifiers.

In the embodiment shown, the equalizer filters $H_a(z)$ and $H_b(z)$ are also variable gain elements (which are digital in this embodiment). These filters may be managed as part of an equalization process to balance the channel transfer functions. That is, equalization will force the frequency response functions of the two channels to be identical as represented in the equation below:

$$F_a(\omega)=F_b(\omega) \qquad (12)$$

where the channel response functions are a combination of the equalizer response and the response of subsequent elements in the channel, including the power amplifier frequency response, i.e.

$$F_a(\omega)=H_a(\omega)G_a(\omega)$$
$$F_b(\omega)=H_b(\omega)G_b(\omega) \qquad (13)$$

The SLMC 320 is responsible for setting the four gain elements, $G_{in}$, $G_a$, $G_b$, and $G_{fb}$; it may also be configured to set the transfer function and net gains of the two equalizers $H_a(z)$ and $H_b(z)$. Both may be accomplished as a feedback controller using sampled signals from various signal paths in the amplifier, such as voltages p and s taken from the input and feedback channel ADC's, 322 and 324, respectively.

The net gain of an equalizer may be, for instance, the mid-band (also referred to as band center) gain, or the gain at some other convenient frequency. Henceforth, the symbols for the transfer functions, without the dependency on frequency, $H_a$, $G_a$ and $F_a$, etc. will be used to indicate the scalar gain (possibly complex) of the transfer functions at the nominal band center frequency. For example, if the equalizers and channel transfer functions are expressed as base band quantities, then the channel gain may be written as follows:

$$H_x=h_x(z)|_{z=1}$$

$$G_x=g_x(s)|_{s=0}$$

$$F_x=H_xG_x \qquad (14)$$

where the subscript x indicates channel a or b.

Signal Level Management Tasks

The SLMC 320, which may be implemented in part as a programmed processor, may be assigned a number of tasks, including one or more of the following:

Maintain the input signal levels of the two ADC's 322 and 324 at or near optimum operating points. For example, this may involve operating at a signal level high enough to increase, and potentially maximize, the signal to noise ratio (SNR) without clipping the signals.

Maintain signal levels within the amplifier channels at or near optimum values. For example, this may involve maintaining the signal levels within the equalizers 334 and 336 and DAC's 340 and 342 high enough to increase, and potentially maximize, SNRs but at the same time prevent arithmetic overflow or clipping within the signal processing elements.

Maintain net overall gain of the LINC amplifier at a preset level. Generally, the net gain will be directly influenced by the input and channel gains $G_{in}$, $G_a$ and $G_b$. However, it will be shown that the net gain is also influenced indirectly by the settings used to maintain the first two tasks listed above.

Signal Level Management Control Structure

Figure 4:
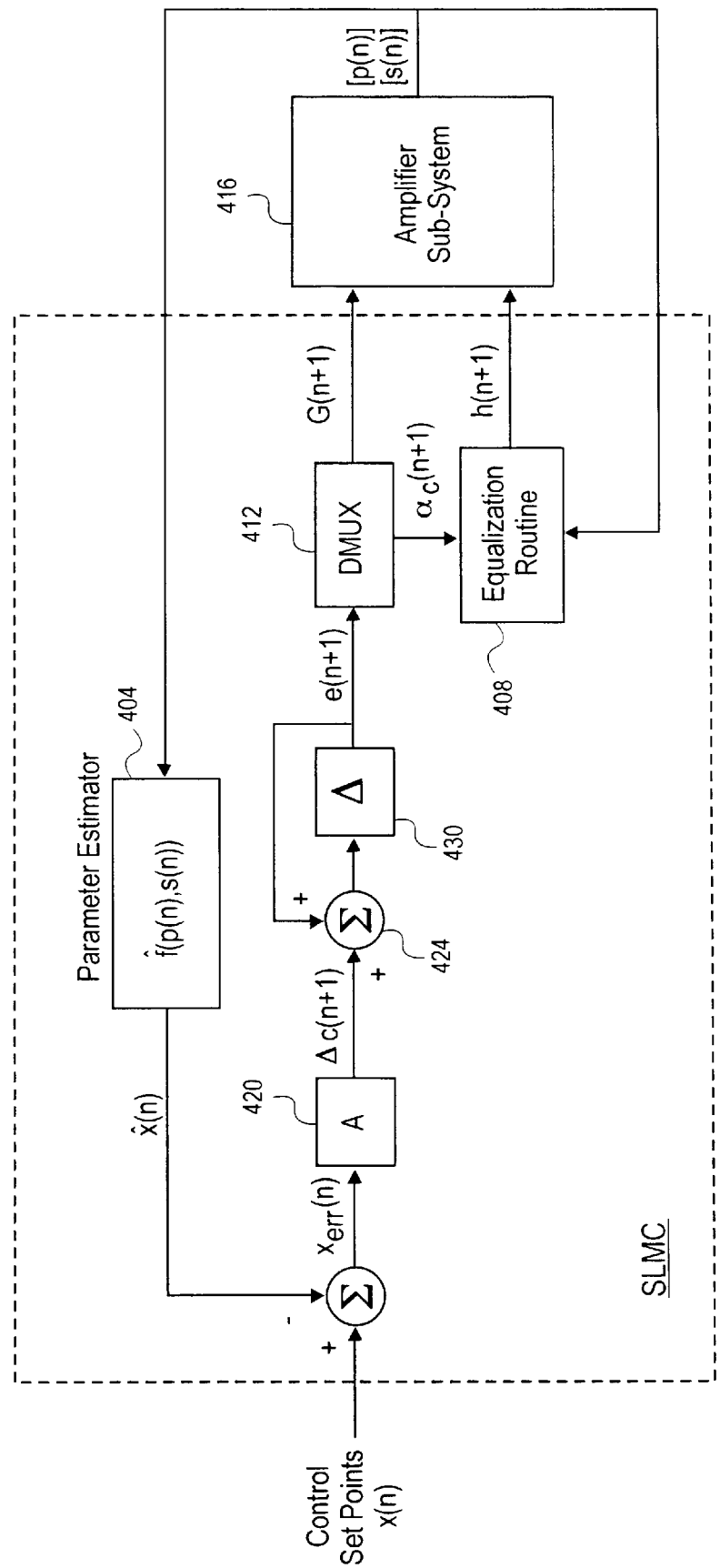

An embodiment of the overall algorithmic control structure for the SLMC 320 is shown in FIG. 4. In that figure, the amplifier subsystem 416 represents some of the elements shown in FIG. 1 and in FIG. 3, except the SLMC 320. The configuration of the SLMC 320 shown in FIG. 4 is that of a multi-dimensional feedback control structure that strives to meet certain parameter set points which have been provided to it. The general operation of the control structure may be described as follows. The individual elements of FIG. 4 will be described further below.

Let x be a vector quantity containing a selected set of amplifier performance values. For instance, $$x=[G_{amp},\sigma_p,\sigma_s,K_a,K_b]^t \qquad (15)$$

where $G_{amp}$ is the net gain of the LINC amplifier, $\sigma_p$ is the standard deviation or rms value of the input to $ADC_{in}$ 322, $\sigma_s$ is the rms value of the input to $ADC_{fb}$ 324, and $H_a$ and $H_b$ are the gains for the two equalizer filters 334 and 336.

For those embodiments in which the SLMC 320 operates in discrete time, let n be the time or block index. For example, the values of x at index n is indicated by x(n) and similarly for other variables to be introduced. Let x(n) be the set of desired or set point values for the performance parameters, which are provided to the SLMC 320 from some external source such as a wireless communication network system operator.

The SLMC 320 provides a set of control parameter values to the amplifier subsystem 416 to modify its performance. In an embodiment, the control parameters include the gain vector $G(n)=[G_{in}(n), G_a(n), G_b(n), G_{fb}(n)]$ and coefficients for the two equalizer filters $h(n)=[h_a(n), h_b(n)]$. The amplifier subsystem 416 in turn provides a set of measured values, p(n) and s(n), back to the SLMC 320.

The SLMC 320 contains, in an embodiment thereof, a parameter estimator 404 that uses the measured data p(n) and s(n) to estimate the values of the selected performance parameters, $\hat{x}(n)$, indicated by the overhat symbol. The difference between the target performance values and the estimated performance values forms an error signal or vector, $x_{err}(n)$. This error vector is processed by the SLMC to generate an updated set of gain values $G(n+1)=[G_{in}(n+1), G_a(n+1), G_b(n+1), G_{fb}(n+1)]$ and a control parameter $\alpha_e(n+1)$ used by an equalization subroutine 408. The latter generates a set of coefficients $h(n+1)=[h_a(n+1), h_b(n+1)]$ used by the equalizer filters 334, 336 contained in the amplifier subsystem 416.

This may complete one exemplary control loop cycle in the SLMC 320. The next sections provide further descriptions regarding the operation of other embodiments of the SLMC.

Overview of an Equalization Subroutine

The control structure in FIG. 4 includes an equalization routine 408. The equalization routine 408 is generally responsible for balancing the composite transfer functions of the two channels as indicated in (12) and (13). This may be accomplished by controlling the transfer functions of the equalizer filters $h_a(z)$ and $h_b(z)$ shown in FIG. 3. The equalization process, in an embodiment, may be based on a method of least square that is more fully described in U.S. Pat. No. 6,215,354 "Closed Loop Calibration for an Amplitude Reconstruction Amplifier". This equalization process may be modified as described herein so that the gains $H_a$ and $H_b$ of the two digital equalizer filters are further adjusted to set the average power levels of the two input sampled signals p(n) and s(n) to be related by $\alpha_e$, i.e.

$$\sigma_s = \alpha_e \sigma_p \quad (16)$$

Generally, $\alpha_e \sim 1$ for the embodiment shown in FIG. 3, depending on the analog signal characteristics and characteristics of the ADC's, but could be set to some other value.

ADC Input Signal Levels ($\sigma_p$, $\sigma_s$ & $\hat{\sigma}_p$, $\hat{\sigma}_s$)

In this and the following sections, at least two expressions will be used, such as equations (17) and (18), where one relates the desired performance parameter to the control parameters, and another relates the desired performance parameter to the observable or measured parameters. The overbar over the gain symbols indicates estimated values whereas the normal gain symbols indicate actual values.

The rms values of the signal levels input to the two ADC's 322 and 324 may be related to the control parameters and the input signal by $$\sigma_p = G_{in}\sigma_u$$
$$\sigma_s = \alpha_e \sigma_p = \alpha_e G_{in} \sigma_u \quad (17)$$

where the later follows from (16).

The estimate signal levels into the two ADC's may be available directly from the measurement data $$\hat{\sigma}_p^2 = E\{|p(n)|^2\}$$
$$\hat{\sigma}_s^2 = E\{|s(n)|^2\} \quad (18)$$

where $E\{\ \}$ is the expectation operator.

Net Amplifier Gain ($G_{amp}$ & $\hat{G}_{amp}$)

The net amplifier gain $G_{amp}$ may be defined as follows $$G_{amp} \triangleq \frac{\sigma_y}{\sigma_u} \quad (19)$$

Substituting, the net amplifier gain may be related to the control parameters by $$G_{amp} = \frac{G_{in}\sigma_s}{G_{fb}\sigma_p} = \frac{\alpha_e G_{in}}{G_{fb}} \quad (20)$$

The estimated net amplifier gain based on the observable measurements may be given by $$\hat{G}_{amp} = \frac{\hat{G}_{in}\hat{\sigma}_p}{\hat{G}_{fb}\hat{\sigma}_s} \quad (21)$$

Equalizer Filter Gain ($H_a$, $H_b$ & $\hat{H}_a$, $\hat{H}_b$)

If the two channels are equalized such that (12) and (13) are satisfied, then it follows from (7) that the amplifier gain may be given by $$G_{amp} = \frac{2A_v F}{A_{clip}} \quad (22)$$

where $F = H_a G_a = H_b G_b$. Rearranging and using the result from (20)

$$F = \frac{A_{clip} G_{amp}}{2A_v} = \frac{\alpha_e A_{clip} G_{in}}{2A_v G_{fb}} \quad (23)$$

Finally $$H_a = \frac{F}{G_a} = \frac{\alpha_e A_{clip} G_{in}}{2A_v G_{fb} G_a} \quad (24)$$

$$H_b = \frac{F}{G_b} = \frac{\alpha_e A_{clip} G_{in}}{2A_v G_{fb} G_b}$$

The equalizer gain may be available from the measurement data. However, since the equalizer filter coefficients are known, the equalizer gain can be computed directly from the coefficients. Assuming $H_a(z)$ and $H_b(z)$ are baseband filters, the equalizer filter gain at band center is $$\hat{H}_a = H_a(z)|_{z=1}$$
$$\hat{H}_b = H_b(z)|_{z=1} \quad (25)$$

Interaction of Control Variables and Controlled Variables

Equations (17), (20), and (24) provide some insight into the interaction between the control parameters ($G_{in}$, $G_a$, $G_b$, $G_{fb}$, and $\alpha_e$) and the performance parameters defined in (15). If the set of control parameters is defined by the vector c:

$$c=[G_{in}, G_{fb}, G_a, G_b, \alpha_e]^t \quad (26)$$

and since the vector x may be some vector function f of the control parameter vector c $$x=f(c) \quad (27)$$

where f is defined by equations (17), (20), and (24), then the sensitivity between the i-th performance parameter, $x_i$, and the j-th control parameter, $c_j$, may be given by the following partial derivative matrix $$\frac{\partial f}{\partial c} = \begin{bmatrix} \frac{\partial f_1}{\partial c_1} & \frac{\partial f_1}{\partial c_2} & \cdots & \frac{\partial f_1}{\partial c_J} \\ \frac{\partial f_2}{\partial c_1} & \frac{\partial f_2}{\partial c_2} & \cdots & \frac{\partial f_2}{\partial c_J} \\ \vdots & & & \vdots \\ \frac{\partial f_I}{\partial c_1} & \cdots & \cdots & \frac{\partial f_I}{\partial c_J} \end{bmatrix} \quad (28)$$

The following table shows the sign of the control exerted by each of the control parameters on the performance parameters. The direction of the arrows indicates the direction of the response of the performance parameter as the control parameter is increased.

TABLE 1

Influence of control parameters on the performance parameters

| | Control Parameters | | | | | |
|---|---|---|---|---|---|---|
| | $G_{in}$ | $G_{fb}$ | $G_a$ | $G_b$ | $\alpha_e$ | Reference |
| Performance Parameters | | | | | | |
| $G_{amp}$ | ↑ | ↓ | — | — | ↑ | Eq (20) |
| $\sigma_p$ | ↑ | — | — | — | — | Eq (17) |
| $\sigma_s$ | ↑ | — | — | — | ↑ | Eq (17) |
| $H_a$ | ↑ | ↓ | ↓ | — | ↑ | Eq (24) |
| $H_b$ | ↑ | ↓ | — | ↓ | ↑ | Eq (24) |

Note that according to this table, only the input signal level, $\sigma_p$, is dependent on a single control variable, $G_{in}$. The rest of the table illustrates the interactive nature of the control parameters. This interaction is taken into account in another embodiment described below.

Algorithm Structure

An embodiment of the signal management scheme's control algorithm is described which adjusts the control parameters to meet the target performance parameters. Referring to FIG. 4, if the performance vector x and control vector c are defined by (15) and (26), then the vector x may be related to control vector c by vector function f as shown in (27). Equation (27) can be linearized for incremental changes in x and c using the partial derivative shown in (28)

$$\Delta x = \frac{\partial f}{\partial c} \Delta c \quad (29)$$
$$= A \Delta c$$

where the matrix A is defined in (28).

If the error signal for the n-th time index is given as $$x_{err}(n) = x(n) - \hat{x}(n) \quad (30)$$

where $\hat{x}(n)$ is the estimated value of x(n) using known values of c(n) and equations (18), (21) and (25), and since $$\hat{x}(n) = \hat{f}(c(n)) \quad (31)$$

then the new control vector at time n+1, c(n+1), may be based on a descent algorithm and given by $$c(n+1) = c(n) + d_c \Delta c(n) \quad (32)$$
$$= c(n) + A^{-1} x_{err}(n)$$

where $\Delta c(n)$ results from the inversion of (29) and $d_c$ is a scalar convergence factor to be used as required. Generally, $d_c \sim 1$ has been proven satisfactory in most cases. This also assumes the matrix A is nonsingular, which is usually the case for a properly defined vector f. An implementation of equation (32) is represented by the matrix multiplication block 420 receiving $x_{err}(n)$ and feeding one input of the summing block 424 while another input of the block 424 receives the previous value of the control variable from a delay block 430.

If a logarithmic or dB notation is used on f, c and x, (e.g. $f_i = 20 \log_{10}(f_i)$), the form of the preceding equation becomes linear with a constant A matrix. In this example, the matrix A becomes $$A = \begin{bmatrix} 1 & -1 & 0 & 0 & 1 \\ 1 & 0 & 0 & 0 & 0 \\ 1 & 0 & 0 & 0 & 1 \\ 1 & -1 & -1 & 0 & 1 \\ 1 & -1 & 0 & -1 & 1 \end{bmatrix} \quad (33)$$

and it's inverse becomes $$A^{-1} = \begin{bmatrix} 0 & 1 & 0 & 0 & 0 \\ -1 & 0 & 1 & 0 & 0 \\ 1 & 0 & 0 & -1 & 0 \\ 1 & 0 & 0 & 0 & -1 \\ 0 & -1 & 1 & 0 & 0 \end{bmatrix} \quad (34)$$

Note that in FIG. 4, the control vector $c=[G, \alpha_e]$ where the four gain elements have been grouped into a single vector $G=[G_{in}, G_{fb}, G_a, G_b]$. A demultiplexer 412 separates the components of c and sends G directly to the amplifier subsystem 416 whereas $\alpha_e$ is supplied to the equalization routine 408. The latter in turn provides the coefficients for the two equalizer filters where again vector notation is used, $h=[h_a, h_b]$. Note that the invention is not limited to the use of $\alpha_e$ for assisting in handling the interaction between the equalization process and the control of performance parameters (such as net gain). Other relationships between the input and output signals (where the output signals may include not just a signal output of the combiner but also signal outputs of the HPAs) may be developed by those of ordinary skill in the art to assist in overcoming the interaction.

Discrete Variable Gain Elements

The variable gain elements $G_{in}$, $G_a$, $G_b$, and $G_{fb}$, may be implemented in the analog sections of the LINC amplifier as previously indicated. In an embodiment, these gain elements may be variable in discrete steps using digital control (e.g. 5-bit control to select 1 of 32 values). It may be that the quantization levels and/or the accuracy of such relatively coarse gain control are not sufficient to achieve the desired level of control for proper SLMC operation. Accordingly, in an embodiment of a gain control mechanism, the discrete gain control problem is addressed by making use of a relatively fine discrete, but limited range, digital gain control available in the digital signal processing subsystem 304 (see FIG. 3) in combination with coarse, discretely variable, analog gain control elements. For example, consider gains $G_a$ and $G_b$ in the two LINC amplifier channels. If $k_a$ and $k_b$ are the control parameters used for the channel gain elements $G_a$ and $G_b$, then the actual gain for the gain element may be given by $$G_a = G_a(k_a)$$
$$G_b = G_b(k_b) \quad (35)$$

Note that the argument in (35) refers to the gain control parameter, not the time index. When necessary to include both, the latter equation may be written as $$G_a = G_a(n, k_a)$$
$$G_b = G_b(n, k_b) \quad (36)$$

to indicate that the gain elements are functions of both the control parameter k and the time index n.

Next, let the signal levels of the constant amplitude signals produced by the LINC modulator 100 (see FIGS. 1 and 3), $A_v$, be programmable values, with $M_a$ and $M_b$ indicating the amplitudes of the two signals. That is $$v_a = M_a e^{j(\beta + \theta)}$$
$$v_b = M_b e^{j(\beta - \theta)} \quad (37)$$

Note that $M_a$ and $M_b$ replaces the fixed $A_v$ used in (2). Now the programmable portion of the channel gains become $$G_a = M_a G_a(k_a)$$
$$G_b = M_b G_b(k_b) \quad (38)$$

Figure 5:
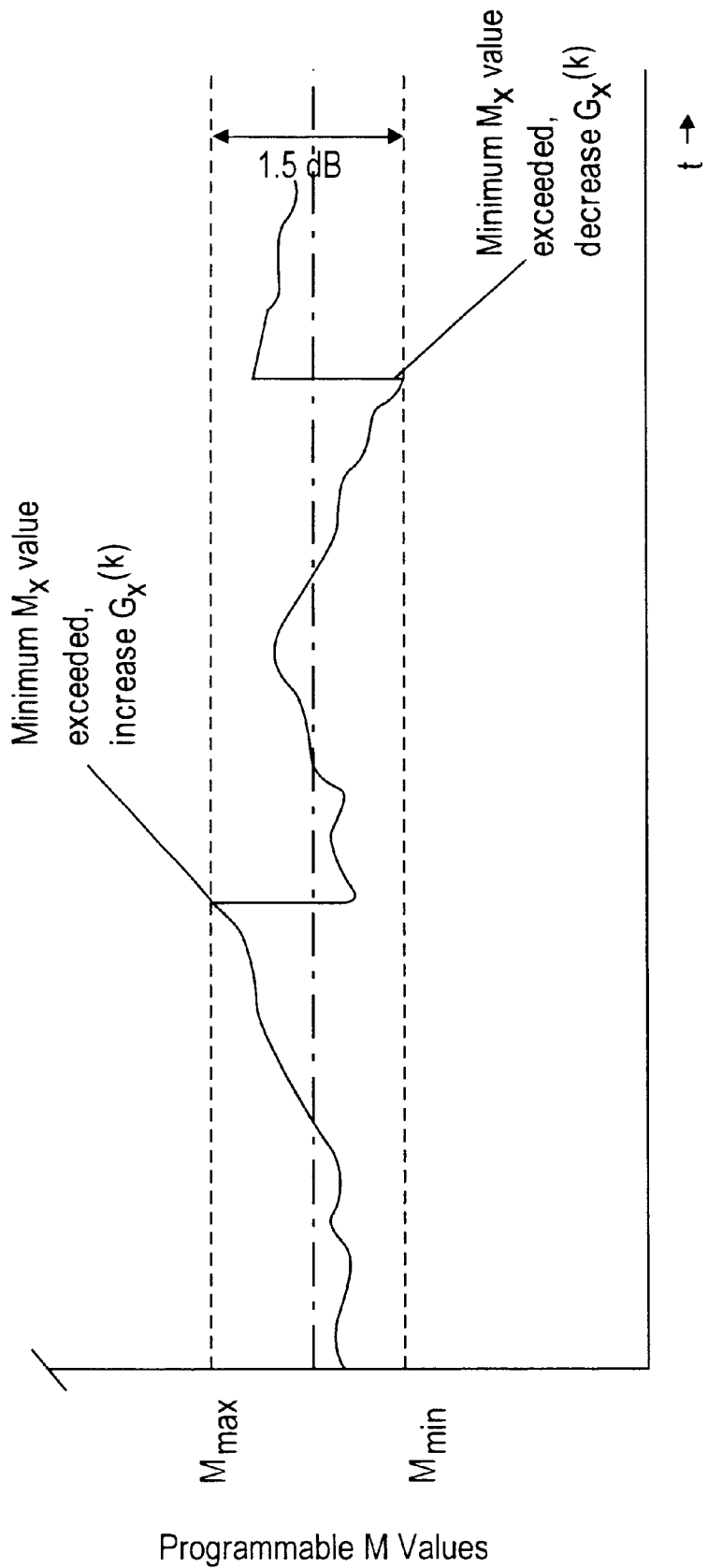

Generally, the M values should remain within a relatively narrow range to maximize the SNR. Let $M_{max}$ and $M_{min}$ define an acceptable range of M values. FIG. 5 shows how the M values can vary while changing the programmable gain elements $G_a$ and $G_b$ in discrete steps. Note that the programmable gain elements need not have uniform steps, but the gain values should be known with sufficient accuracy if the steps are to retain the precision associated with control of the M values. If necessary, the programmable gain elements can be calibrated to achieve the desired accuracy. The allowed range of the M values should exceed the incremental gain values available from the discrete gain G(k) to provide overlapping coverage. In addition, this provides a certain amount of hysteresis to avoid chattering at the switch boundaries. A similar control strategy can be employed by using $\alpha_e$ for fine digital control and other gain elements such as $G_{in}$ and $G_{fb}$ to provide coarse analog control.

Figure 6:
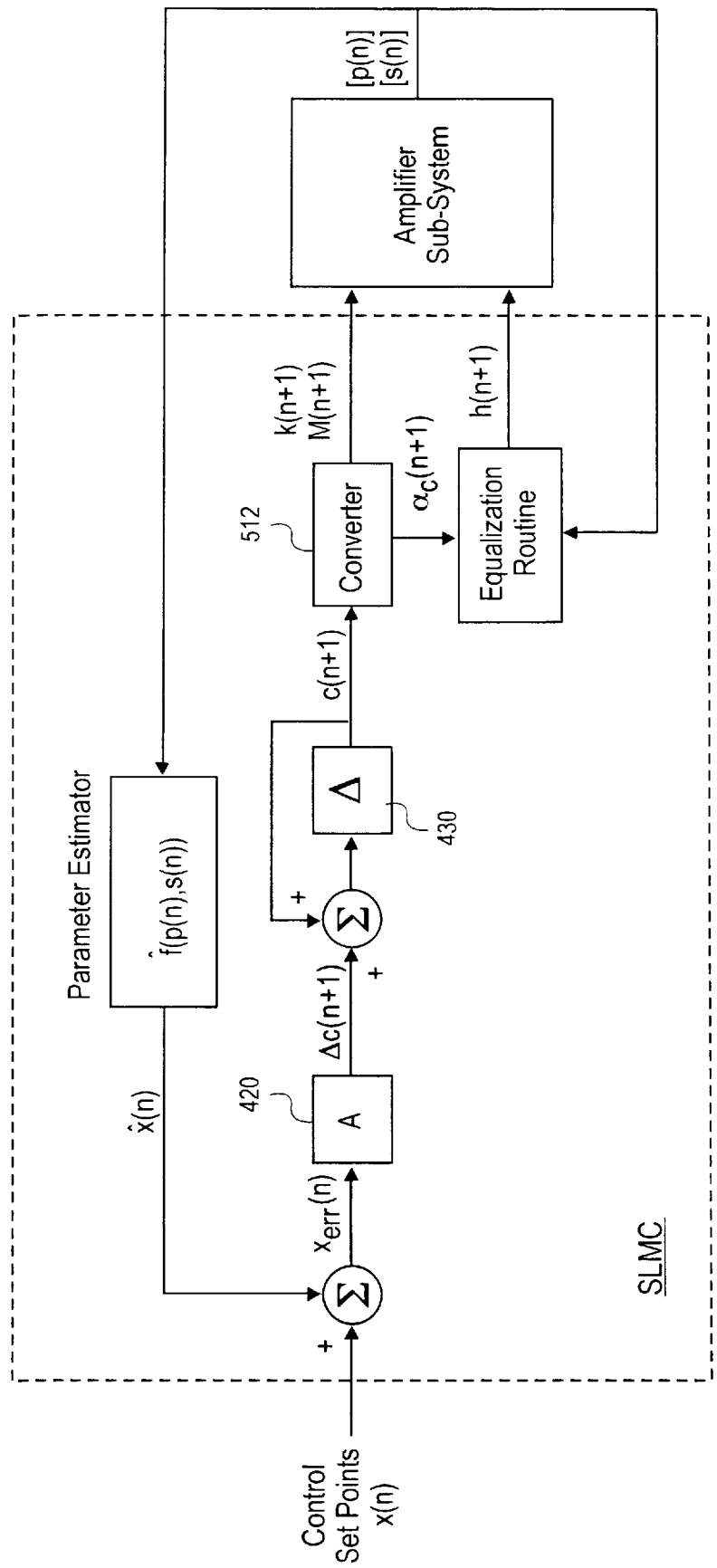

Another embodiment of the SLMC 320 is shown in FIG. 6 that provides for both coarse and fine control. A converter 512 replaces the demultiplexer 412 shown in FIG. 4 and is responsible for converting the desired gain values obtained from the control vector c into a set of coarse gain control values, k, and a set of fine gain control values, M and $\alpha_e$. Here $M = [M_a, M_b]$ is the vector quantity to set the signal levels from the LINC modulator while $k = [k_{in}, k_{fb}, k_a, k_b]$ likewise is a vector quantity that includes the discrete control for, in this embodiment, four programmable analog gain elements. An embodiment of this process is described in the next section.

A Converter Algorithm

Let $G(k) = [G_{in}(k_{in}), G_{fb}(k_{fb}), G_a(k_a), G_b(k_b)]$ denote the coarse gain values for the gain element available using the control parameter vector $k = [k_{in}, k_{fb}, k_a, k_b]$. Let $M = [M_a, M_b]$ and $\alpha_e$ be the finely variable gain parameters. Let $G_c = [G_{cin}, G_{cfb}, G_{ca}, G_{cb}]$ be the target gains contained in the control vector c provided to the converter 512. Assume some control variable c is provided to the converter 512 containing the desired gain $G_c$. Also assume the logarithmic notation is used throughout the following sections. An embodiment of a converter algorithm is as follows:

1. Since the signal level into the input ADC, $\sigma_p$, is controllable only by gain element $G_{in}$, the following code fragment may be used to set $G_{in}$: Let $\Delta\sigma_p$ the the allowable variation in input signal level to the input ADC.

```
IF G_cin(n) - G_in(n,k_in(n)) > Δσ_p,
    k_in(n+1) = k_in(n) - 1.
ELSEIF G_cin(n) - G_in(n,k_in(n)) < -Δσ_p,
    k_in(n+1) = k_in(n) + 1.
ELSE
    k_in(n+1) = k_in(n)
END
```

2. For coarse gain elements $G_a$ and $G_b$ and fine gain elements $M_a$ and $M_b$, the following code segment may be used. Let $\Delta M$ be the allowable variation in the M values about some nominal operating point. For x=a,b

```
IF G_cx(n+1) - G_x(n,k_in(n)) > ΔM,
    k_x(n+1) = k_x(n) - 1.
    M_x(n+1) = G_cx(n+1) - G_x(n,k_x(n+1))
ELSEIF G_cx(n+1) - G_x(n,k_in(n)) < -ΔM,
    k_x(n+1) = k_x(n) +- 1.
    M_x(n+1) = G_cx(n+1) - G_x(n,k_x(n+1))
ELSE
    M_x(n+1) = G_cx(n+1) - G_x(n,k_x(n))
END
```

3. For coarse gain element $G_{fb}$ and fine gain element $\alpha_e$, the following code segment may be used. Let $\Delta\alpha_e$ be the allowable variation in $\alpha_e$ about some nominal operating point.

```
IF G_cfb(n+1) - G_fb(n,k_fb(n)) > Δα_e,
    k_fb(n+1) = k_fb(n) - 1.
    α_e(n+1) = G_cfb(n+1) - G_fb(n,k_fb(n+1))
ELSEIF G_cfb(n+1) - G_fb(n,k_fb(n)) < Δα_e,
    k_fb(n+1) = k_fb(n) + 1.
    α_e(n+1) = G_cfb(n+1) - G_fb(n,k_fb(n+1))
ELSE
    α_e(n+1) = G_fb(n+1) - G_fb(n,k_fb(n))
END
```

4. This may complete one SLMC control cycle, according to an embodiment of the invention.

Figure 7:
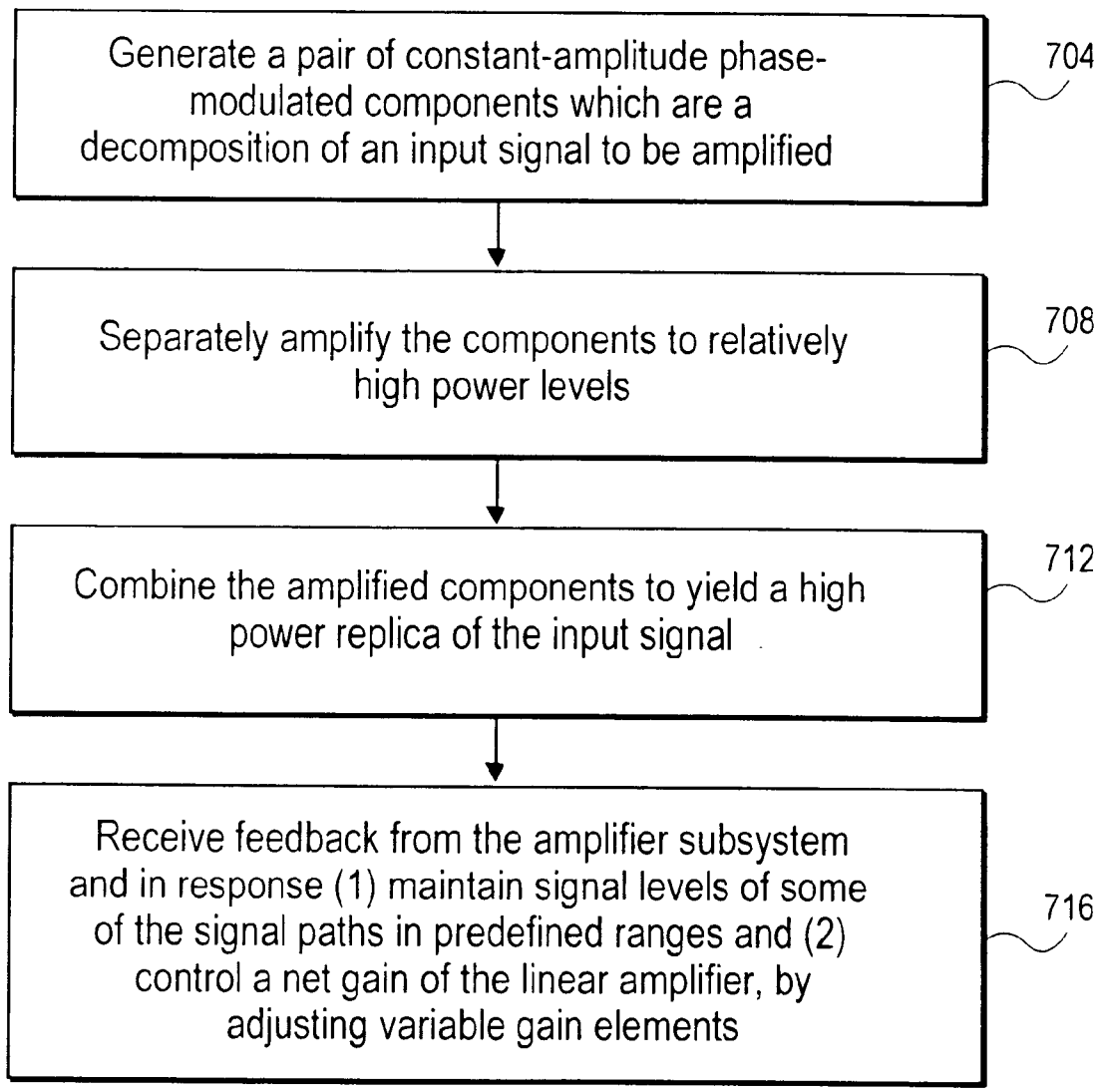

An embodiment of a method for operating a LINC amplifier is described in flow diagram form in FIG. 7. Beginning with operation 704, a pair of constant-amplitude phase-modulated components which are a decomposition of an input signal are generated. This may be implemented, for instance, using an entirely digital processing system in which the LINC modulator 100 (see FIGS. 1 and 3) may be completely implemented in digital form such as a programmed processor or as a programmable logic array for greater speed of operation. These components are separately amplified to relatively high power levels (operation 708). The amplified components are combined to yield a high power replica of the input signal (operation 712). In the embodiment in which the LINC modulator is entirely implemented by digital techniques, the components provided by the modulator are converted to analog form, and optionally frequency translated up to an RF range, prior to being amplified and combined.

A signal level management scheme is provided that generates commands that cause gain changes in a number of signal paths of the LINC amplifier. These commands are generated in response to receiving feedback concerning the combined form of the amplified components, as well as perhaps in response to other signals such as the input signal and signals within the gain channels of the LINC amplifier. These commands cause gain changes in order to maintain signal levels of some of the signal paths within predefined ranges. In addition, the commands are to cause gain changes such that a net gain of the LINC amplifier is controlled (operation 716). For instance, it may be desirable to maintain the net gain of the LINC amplifier at a constant level despite variations that are introduced into the gain channels of the LINC amplifier. These variations may be for instance changes to equalizer filter gains that are designed to balance the frequency response of the different channels of the LINC amplifier that feed the combiner.

To summarize, various embodiments of a signal management scheme for a LINC amplifier have been described. It will however be evident that various modifications and changes may be thereto without departing from the broader spirit and scope of the invention as set forth in the appended claims. For instance, although some of the embodiments described above focus on the particular example of obtaining constant net gain, the same techniques may be used to control the net gain for other purposes, including those that have to do with insuring that other performance parameters, such as combiner output power, are kept within predefined ranges. In addition, although the above-described embodiments have two gain channels in the LINC amplifier, the signal management technique can be extended to amplifiers having more than two gain channels. For an example of such a LINC amplifier, see U.S. Pat. No. 6,147,553 to Kolanek. The invention is not limited to the dual channel or the constant net gain embodiments described above. The specification and drawings are accordingly to be regarded in an illustrative rather than a restrictive sense.

What is claimed is:

1. An amplifier comprising:
an amplifier subsystem having a modulator to generate a pair of constant-amplitude phase-modulated components in response to an input signal, a pair of channels which include a pair of power amplifiers coupled to amplify the components, respectively, a combiner coupled to combine the amplified components, and a plurality of variable gain elements coupled into some of a plurality of signal paths of the amplifier subsystem; and
a controller coupled to receive feedback from the amplifier subsystem
wherein the amplifier subsystem further comprises a first A/D converter coupled to digitize the input signal in a signal path to the modulator and a second A/D converter coupled to digitize a feedback signal in a signal path between an output of the combiner an input of the controller, and wherein the plurality of variable gain elements include a first analog variable gain element coupled to adjust a signal level into the first A/D converter and a second analog variable gain element coupled to adjust a signal level into the second A/D converter, and wherein the plurality of variable gain elements further include third and fourth analog variable gain elements coupled to adjust the corrected components, respectively, prior to amplification.

2. The linear amplifier of claim 1 wherein the amplifier further comprises a down converter coupled to translate the input signal into a lower frequency range prior to being digitized, and an up converter coupled to translate the corrected components into an RF range prior to amplification.

3. The linear amplifier of claim 1 wherein some of the plurality of gain elements provide coarse, discretely variable gain and others provide fine, discretely variable gain, the controller further includes a converter to translate gain change commands into commands to the coarse and fine variable gain elements.

4. The linear amplifier of claim 3 wherein the fine, discretely variable gain elements are digitally implemented.

5. A method for operating a LINC amplifier, comprising:
generating a pair of constant-amplitude phase-modulated components in response to an input signal;
separately amplifying said components to a relatively high power level; combining said amplified components; and
generating commands that cause gain changes in a plurality of signal paths of the LINC amplifier, in response to receiving feedback concerning said amplified components, to simultaneously (1) maintain signal levels of some of the plurality of signal paths in predefined ranges that improve one of signal to noise ratio and clipping in said signal paths and (2) maintain one of a net gain and an output power of the LINC amplifier in a predefined range.

6. The method of claim 5 wherein the feedback concerns a combined form of said amplified components.

7. The method of claim 5 further comprising making amplitude and phase corrections to one or both of said components so that variation in frequency response between the pair of channels is reduced as part of an equalization process, controlling a net gain of the equalization process, controlling digital filtering coefficients used in the equalization process, and controlling signal levels within the equalization process to maintain the net gain of the LINC amplifier in a predefined range and simultaneously reduce the likelihood of overflows in the equalization process.

8. The method of claim 7 further comprising:
translating the input signal into a lower frequency range prior to digitization; and
translating the corrected components into an RF range prior to amplification.

9. A method for operating a LINC amplifier, comprising:
generating a pair of constant-amplitude phase-modulated components in response to an input signal;
separately amplifying said components to a relatively high power level;
combining said amplified components;
generating commands that cause gain changes in a plurality of signal paths of the LINC amplifier, in response to receiving feedback concerning said amplified components, to (1) maintain signal levels of some of the plurality of signal paths in predefined ranges and (2) control a net gain of the LINC amplifier;

digitizing the input signal prior to generating said components; and digitizing a feedback signal related to said amplified components, and wherein said commands cause adjustments to analog levels of the input signal and the feedback signal prior to digitization.

10. The method of claim 9 wherein the commands cause adjustments in the corrected components prior to amplification.

11. The method of claim 9 wherein some of the plurality of gain elements are to provide coarse, discretely variable gain and others are to provide fine, discretely variable gain, the controller further includes a converter to translate gain change commands into commands to the coarse and fine variable gain elements.

12. A linear amplifier comprising:

a first A/D converter to digitize an input signal;

a modulator coupled to an output of the first A/D converter to generate a pair of constant amplitude phase modulated components in response to the input signal;

a pair of channels including an equalizer coupled to provide amplitude and phase corrections to one or both of the components, a D/A converter coupled to convert the corrected components into analog form, and a pair of phase-preserving power amplifiers coupled to amplify the corrected components, respectively;

a combiner coupled to combine the amplified components; and a controller coupled to receive feedback from at least one of the pair of channels and the combiner, and in response control the equalizer so that variation in frequency response between the channels is reduced, wherein the controller is to further represent the influence of a plurality of control parameters upon a plurality of performance parameters in the amplifier, determine a plurality of current values of the performance parameters, and determine a plurality of values of the control parameters that allow the amplifier to meet a plurality of target values for the performance parameters, the control parameters are to control (1) a first analog variable gain element coupled to adjust an input signal level of the first A/D converter, and (2) a second analog variable gain element coupled to adjust an input signal level of a second A/D converter that is in a feedback path from an output of the combiner, and the performance parameters represent net amplifier gain and input signal level to the first A/D converter.

13. The amplifier of claim 12 further comprising:

an down converter coupled to translate the input signal into a lower frequency range prior to being digitized; and an up converter coupled to translate the corrected components into an RF range prior to being amplified.

14. The amplifier of claim 12 wherein the control parameters are to further control third and fourth analog variable gain elements coupled to adjust the corrected components, respectively, prior to amplification.

15. The amplifier of claim 12 wherein the controller is to further control a net gain of the equalizer, digital filter coefficients of the equalizer, and signal levels within the equalizer to maintain the net gain of the linear amplifier in a predefined range and simultaneously reduce the likelihood of overflows in the equalizer.

* * * * *